(12) United States Patent
Yang

(10) Patent No.: US 6,392,427 B1
(45) Date of Patent: May 21, 2002

(54) TESTING ELECTRONIC DEVICES

(75) Inventor: Hsu Kai Yang, Pleasanton, CA (US)

(73) Assignee: Kaitech Engineering, Inc., Pleasanton, CA (US)

( * ) Notice: Subject to any disclaimer, the term of this patent is extended or adjusted under 35 U.S.C. 154(b) by 0 days.

(21) Appl. No.: 09/217,388

(22) Filed: Dec. 21, 1998

(51) Int. Cl.[7] .......................... G01R 31/02; G01R 31/26
(52) U.S. Cl. ...................... 324/755; 324/758; 324/765; 324/158.1
(58) Field of Search ................ 324/755, 758, 324/765, 158.1

(56) References Cited

U.S. PATENT DOCUMENTS

| | | | |
|---|---|---|---|
| 3,824,462 A | 7/1974 | Vinsani | 324/555 |
| 4,045,735 A * | 8/1977 | Worcester et al. | 324/537 |
| 4,145,620 A | 3/1979 | Dice | 324/501 |
| 4,488,354 A | 12/1984 | Chan et al. | 361/803 |
| 4,514,786 A | 4/1985 | Charruau | 361/803 |
| 4,900,948 A | 2/1990 | Hamilton | 324/158.1 |
| 5,075,962 A * | 12/1991 | Gibson | 29/884 |
| 5,175,491 A | 12/1992 | Ewers | 324/755 |
| 5,180,974 A | 1/1993 | Mitchell et al. | 324/755 |
| 5,221,812 A * | 6/1993 | Long | 29/854 |
| 5,247,248 A | 9/1993 | Fukunaga | 324/768 |
| 5,304,738 A * | 4/1994 | Long | 29/854 |
| 5,479,105 A | 12/1995 | Kim et al. | 324/755 |
| 5,495,179 A | 2/1996 | Wood et al. | 324/755 |
| 5,578,934 A | 11/1996 | Wood et al. | 324/758 |
| 5,644,247 A | 7/1997 | Hyun et al. | 324/755 |
| 5,650,732 A | 7/1997 | Sakai | 324/755 |
| 5,652,523 A | 7/1997 | Noguchi | 324/755 |
| 5,696,033 A * | 12/1997 | Kinsman | 257/787 |
| 5,789,803 A * | 8/1998 | Kinsman | 257/787 |
| 5,825,195 A | 10/1998 | Hembree et al. | 324/755 |

FOREIGN PATENT DOCUMENTS

| DE | 197 18 870 A1 | 11/1997 |
|---|---|---|
| GB | 2189947 A | 11/1987 |

OTHER PUBLICATIONS

KES Systems, "GEN–1" pp. 1–5, publicly available at least as early as Oct. 26, 1998.

Amkor Technology, "New Parallel Strip Test Handling Process," p. 1, publicly available at least as early as Oct. 26, 1998.

Amkor Electronics, Diagram of Die and Lead Frame, p. 1, dated Apr. 1995.

* cited by examiner

*Primary Examiner*—Safet Metjahic
*Assistant Examiner*—Jermele M. Hollington
(74) *Attorney, Agent, or Firm*—Trop, Pruner & Hu, P.C.

(57) ABSTRACT

A test assembly contains a plurality of electronic devices that are attached to a lead frame. Leads of the electronic devices are trimmed from the lead frame to electrically isolate the leads. At least a portion of the lead frame is mounted into a socket in the test assembly.

24 Claims, 6 Drawing Sheets

TESTING ELECTRONIC DEVICES

BACKGROUND

The invention relates to testing electronic devices such as integrated circuit devices.

Various tests may be performed on electronic devices such as integrated circuit (IC) devices, including functional tests, burn-in tests, and other tests. Conventionally, several techniques are available to test IC devices. For example, one type of testing involves testing singulated, packaged units (units that have been separated from other units during assembly). Multiple singulated, packaged units (e.g., eight, sixteen or more) may be mounted on a test structure and tested in parallel. IC devices that have been tested in this manner include such high density memory products as dynamic random access memories (DRAMs), static random access memories (SRAMs), electrically erasable and programmable read-only memories (EEPROMs), and flash memories. However, such test techniques typically employ relatively expensive handlers and the number of units that can be tested in parallel may be rather limited. Further, mounting singulated, packaged units into a test system may employ a relatively large amount of space since individual sockets are provided for each unit.

A test technique that allows a greater extent of parallel testing involves mounting singulated, packaged units onto load boards that have individual sockets to receive the singulated units. Each load board may contain a relatively large number of units, and several load boards may be mounted in a temperature chambers for testing. However, such load boards conventionally employ relatively expensive loading and unloading equipment, and test equipment used with the load boards may require a relatively large amount of space. Further, a tester for handling load boards having hundreds or even thousands of units may tend to be rather expensive.

Another test technique includes testing encapsulated, but not singulated, devices that are still attached to the mold strip. These devices are tested by contacting mechanical probes to the leads of units that are attached to the strip. Because of the use of contact probes, however, a large number of devices are not tested at the same time. Such a technique is typically convenient for products such as transistors or diodes that have short test times, that do not require complicated test patterns such as those used with more complex IC devices (e.g., DRAMs, EEPROMs, and so forth), and that do not need to be tested in a temperature chamber for testing at different temperatures.

A need thus exists for an improved test method and apparatus for electronic devices including IC devices.

SUMMARY

In general, according to one embodiment, a test apparatus includes a lead frame portion on which are attached a plurality of electronic device units each having one or more pins. The lead frame portion may be mounted in a socket having conductors electrically coupled to corresponding pins of the electronic device units.

Other features and embodiments will become apparent from the following description and from the claims.

DETAILED DESCRIPTION

In the following description, numerous details are set forth to provide an understanding of the present invention. However, it is to be understood by those skilled in the art that the present invention may be practiced without these details and that numerous variations or modifications from the described embodiments may be possible.

Figure 1:
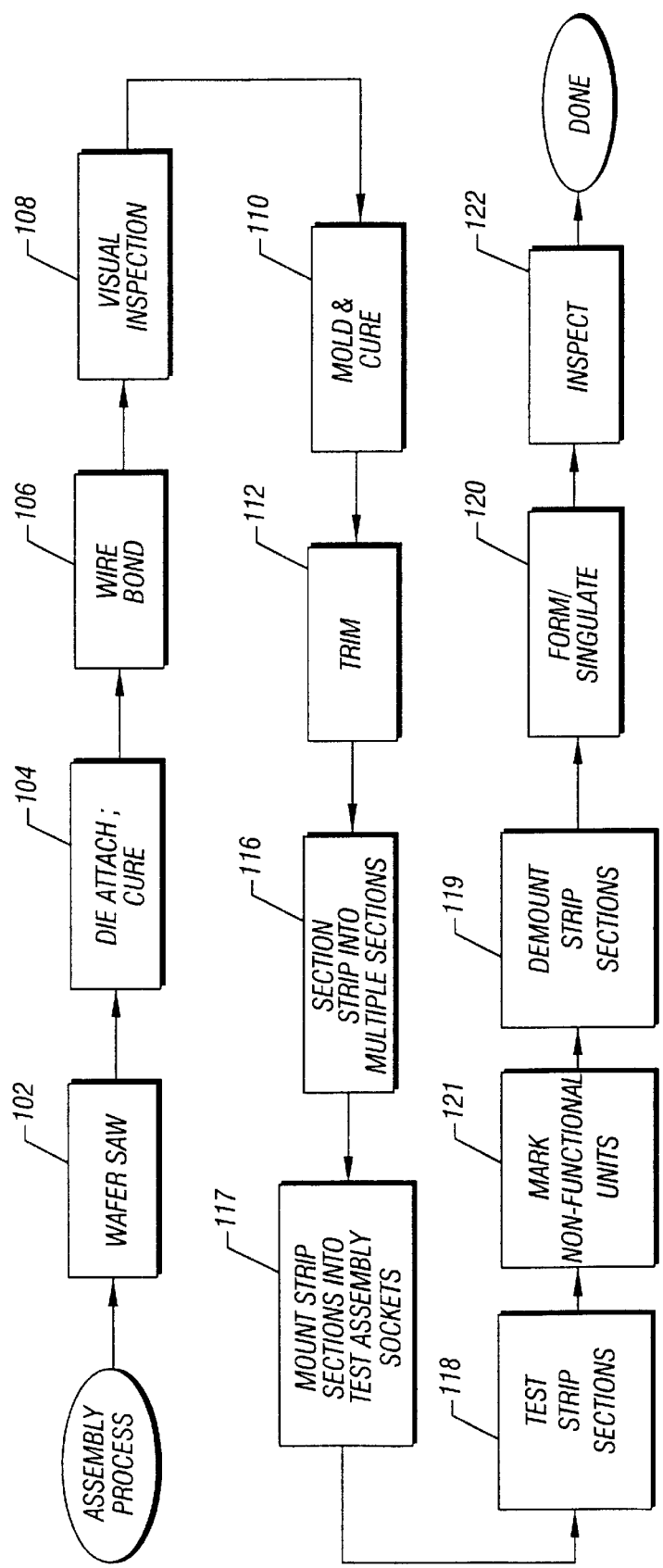
FIG. 1 is a flow diagram of an embodiment of an assembly process of an electronic device such as an integrated circuit (IC) device.

Referring to FIG. 1, a process according to one embodiment includes a process for assembling and testing integrated circuit (IC) device units, which may be electrically erasable and programmable read-only memories (EEPROMs) or other devices. In one embodiment, a test assembly is formed during the process that includes a plurality of encapsulated but not singulated IC units that are still attached to a lead frame (also referred to as a mold strip). The test assembly may include a large number of IC units (e.g., hundreds or thousands) attached to the whole or several sections of a lead frame or strip. The multiple IC units in each strip portion (which may be the whole strip or a strip section) may be tested in parallel. The test assembly including the strip portion or portions may be handled as a single entity to reduce handling costs. Attaching many IC units to the strip or lead frame portion and mounting that portion in the test assembly may also reduce the footprint needed in the test assembly to receive a relatively large number of IC units.

In one embodiment, the lead frame or strip may be cut into several sections, with each section mounted in a corresponding socket on the test assembly. In another embodiment, the strip is not separated into sections but instead the entire strip maybe mounted into a socket on the test assembly. For purposes of this application, the whole lead frame or strip or a section of the lead frame or strip may both be referred to as a lead frame portion or a strip portion.

Each socket includes electrical conductors or contacts that are adapted to electrically couple corresponding leads of units that are attached to a strip or strip section. The test assembly may include some type of support structure, such as a multi-layer printed circuit board (PCB), on which one or more sockets may be mounted. Additional passive and active elements (e.g., resistors, capacitors, switches, multiplexers, signal traces, and the like) may also be coupled on the support structure to enable test signals to be routed to the IC units mounted in sockets on the support structure. A load board is an example of a test assembly that includes a PCB with one or more sockets and other elements.

Initially, each IC unit may include a die that is formed on a semiconductor wafer along with other dies. To separate the dies on a wafer during the assembly process, a saw in an assembly machine cuts (at 102) the wafer into individual dies. Next, the assembly machine attaches (at 104) the separated dies to a lead frame (or mold strip) with die attach material, which may include electrically conductive epoxy, for example. The strip may have hundreds or even thousands, as examples, of sites that are attached to corresponding dies. A strip with attached dies may be subjected to high temperature to cure the die attach material to form a strong bond.

Next, the assembly machine wire bonds (at 106) the dies to leads on the strip by attaching wires between bond pads on each die and corresponding leads on the strip. A visual inspection may then be performed (at 108) to ensure integrity of the die attachment and wire bonding on the strip.

Next, one or more strips may be loaded (at 110) into a molding machine, which may be a plastic injection molding machine, for example. In the molding machine, plastic molding compound may be injected into molds to encapsulate the dies and wire bonds. The strips with plastic encapsulated units are then subjected to high temperature to cure the plastic molding compound. At this point, the leads of each unit are still integrally attached to the lead frame or strip material. The leads are next trimmed (at 112) to remove the lead frame material coupling the leads (as illustrated in FIG. 2).

Figure 2:
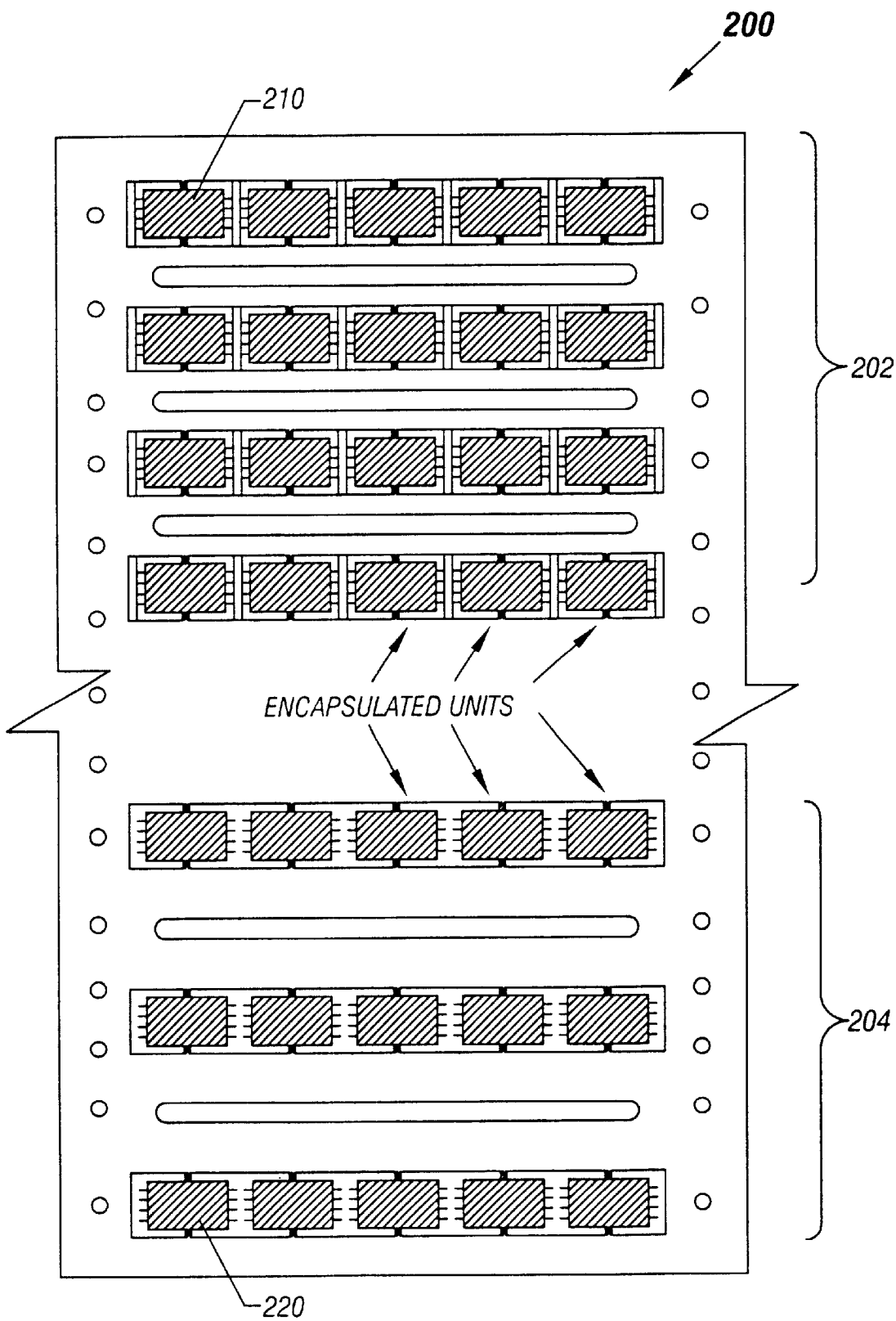
FIG. 2 illustrates a lead frame attached to multiple encapsulated units formed in one step of the process of FIG. 1.
Figure 3A:
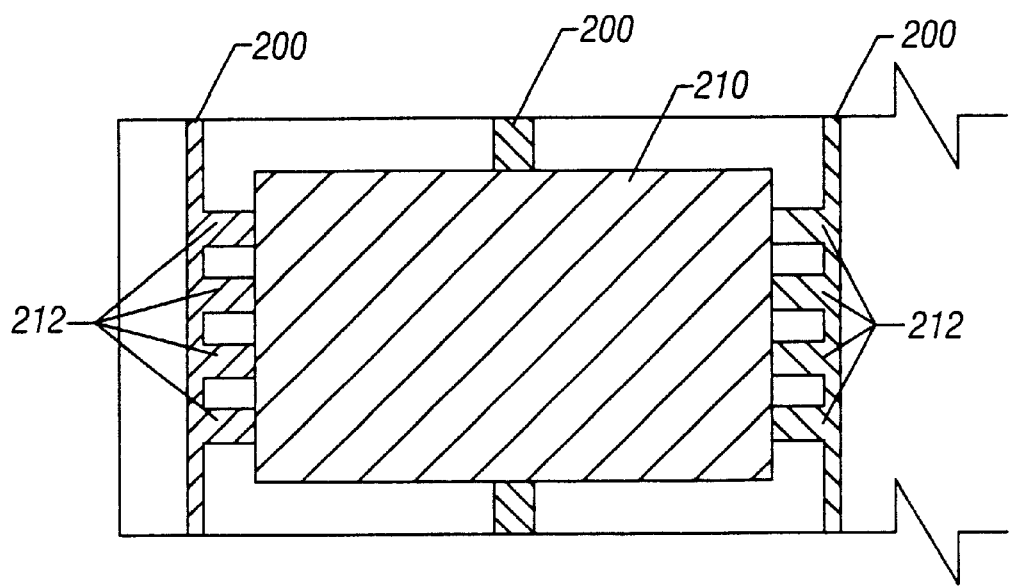
FIGS. 3A–3B illustrate enlarged views of portions of the assembly of FIG. 2.
Figure 3B:
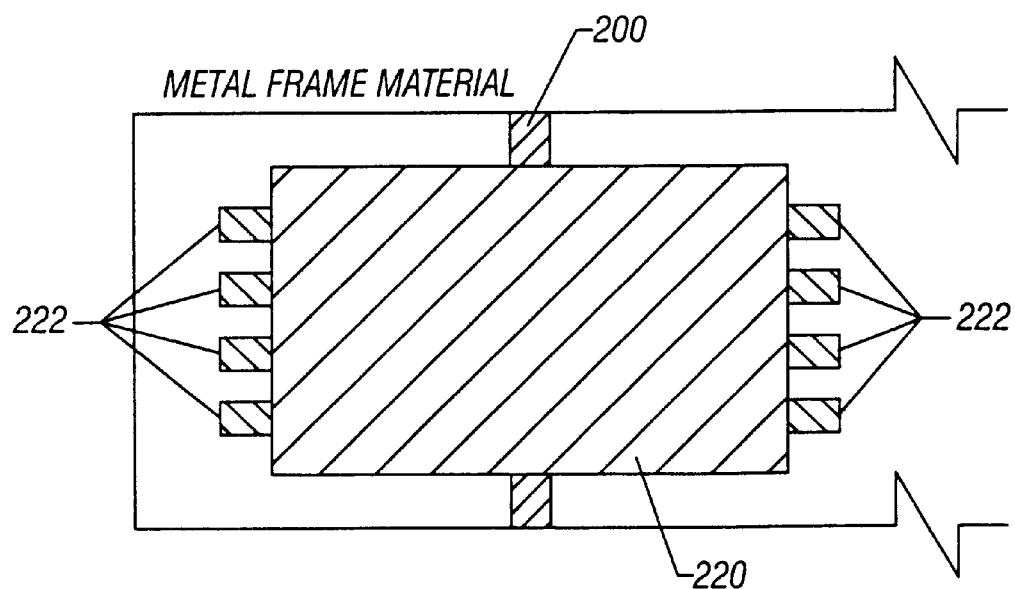

Referring further to FIG. 2, a strip or lead frame 200 includes a first segment 202 and a second segment 204. In the first segment 202, leads or pins 212 of IC units 210 have not yet been trimmed and they remain integrally attached to the lead frame 200, as illustrated in FIG. 3A. Leads or pins 222 of IC units 220 in the second segment 204 have been trimmed, that is, the leads 222 of the IC units have been separated from the lead frame 200, as illustrated in FIG. 3B. However, after the trimming process, the bodies of the packaged units 220 remain attached to the lead frame 200 although their leads 222 have been separated. Thus, encapsulated IC units remain attached to the lead frame 200 but their individual leads or pins are electrically isolated to allow separate electrical access to each IC unit 220.

After trimming, the encapsulated IC units still hold relatively good mechanical tolerances with respect to the lead frame 200 to allow the assembly including the IC, units and lead frame to be easily handled collectively as one entity. Once a strip portion is mounted in a socket, the leads of the IC units are protected against mechanical damage. As a result, the socket may be designed to be rather rugged so that it can be handled manually or automatically as an individual unit. In effect, instead of separately handling tens to hundreds of IC units, embodiments of the invention allow such IC units to be handled as a collection. In addition, no expensive handling equipment may be needed.

Referring again to FIG. 1, according to one embodiment, each strip may then be cut into several sections (at 116) to form multiple strip sections, with each strip section including multiple encapsulated IC units. The strip sections may then be mounted (at 117) into respective sockets in a test assembly. The size of and number of IC units that each section includes depends on the type and technology of socket used. In an alternative embodiment, if a socket is capable of receiving an entire strip, then the strip would not need to be separated into sections.

Figure 4:
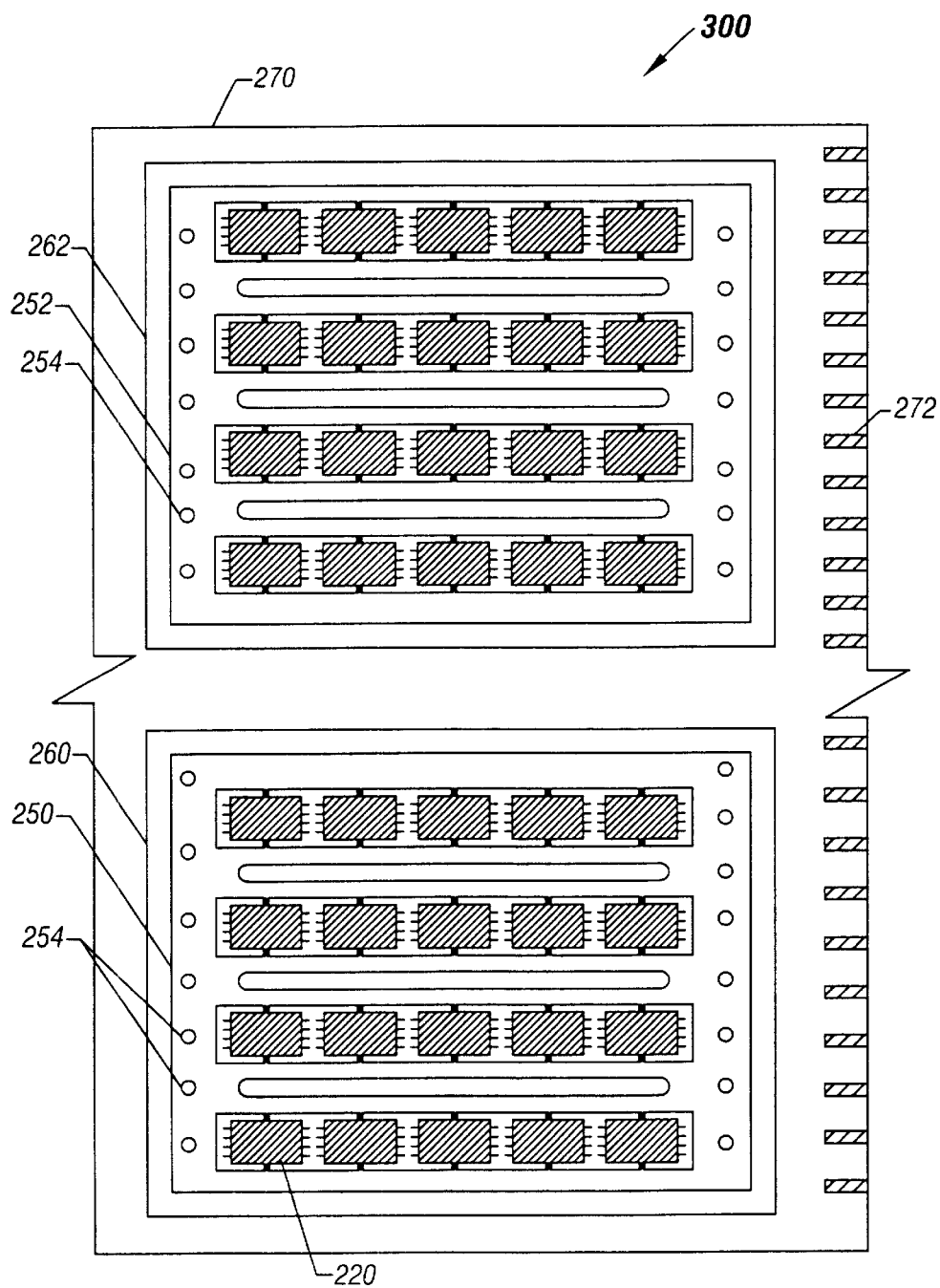
FIG. 4 illustrates a test assembly according to one embodiment formed during the assembly process of FIG. 1 for use with a test system.

As further shown in FIG. 4, a test assembly 300 (which may be a load board, for example) includes multiple (two or more) sockets (260, 262 illustrated) in which are mounted strip sections 250, 252, respectively. The sockets 260, 262 are attached to a support structure 270, which may be a PCB, for example. In an alternative embodiment, an entire strip (not cut into sections) may be mounted in a single socket on the support structure 270.

Edge connectors 272 may be formed on the support structure 270 for coupling to channels in a test system. One or more test assemblies (each including the support structure 270, one or more sockets 260, 262, and a strip or strip sections having multiple encapsulated but not singulated IC units) may be loaded into the test system. In the illustrated embodiment of FIG. 4, each socket 260, 262 may have a cover (not shown) to hold the strip section in place.

To align each strip section 250, 252 to a socket 260, 262, one or more alignment or guide holes 254 may be included in each strip section. Such guide holes 254 are typically formed during the assembly process for mechanical alignment and other purposes. The guide holes 254 may be fitted into receiving pins or rods in each socket so that conductors or contacts in each socket are properly aligned to and in electrical communication with corresponding leads or pins of IC units attached to the strip section.

Figure 5:
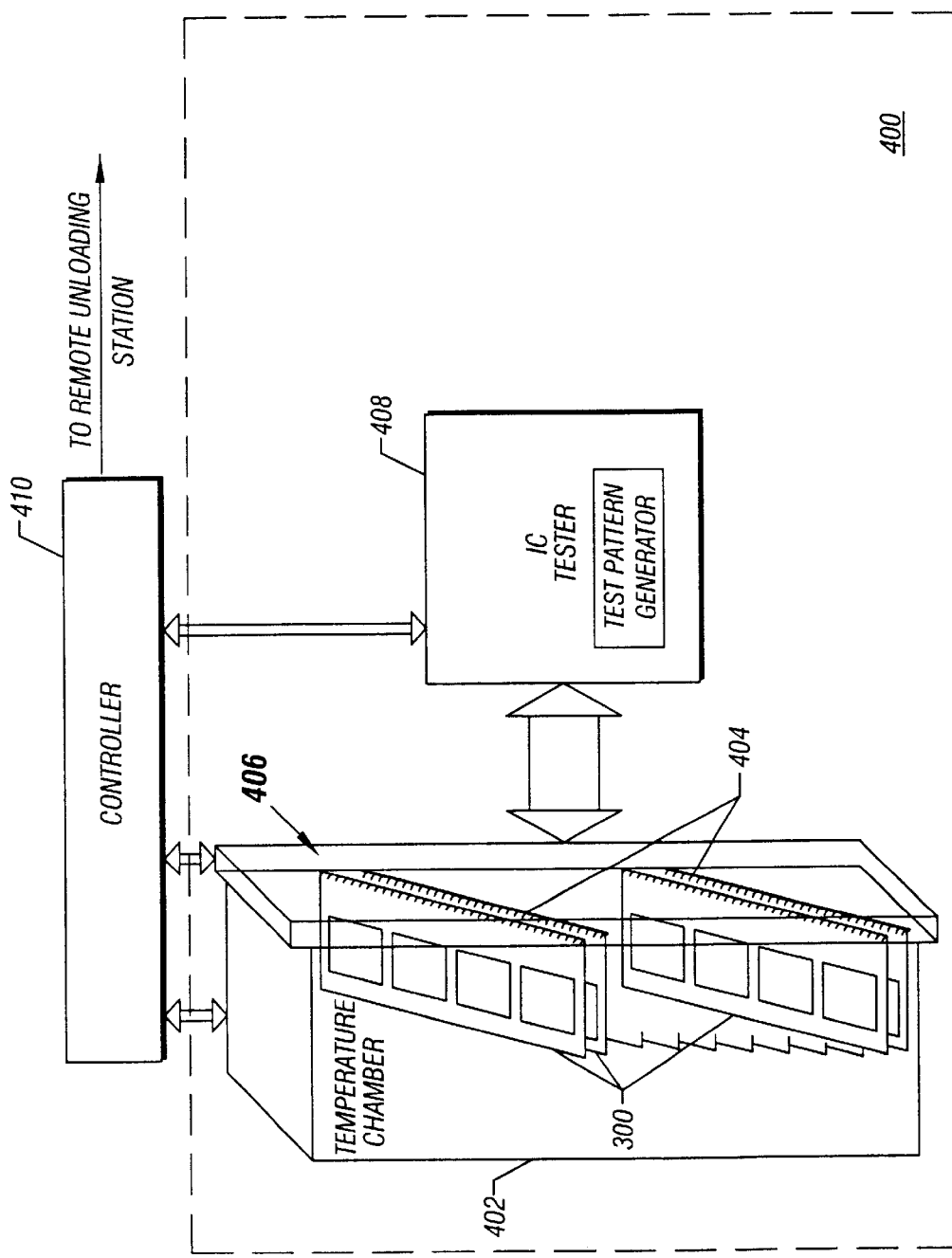
FIG. 5 illustrates a test system in which the test assembly of FIG. 4 may be mounted.

After the strip sections 250, 252 are mounted in sockets 260, 262 in the test assembly 300, one or more of the test assemblies 300 may be loaded (at 118) into a tester, such as the tester shown in FIG. 5. After test operations, functional and non-functional IC units are identified, with the non-functional units marked (e.g., inked) (at 121) for later identification. The strip sections are demounted or removed (at 119) from the sockets and fed back to the assembly machine for form and singulate operations (at 120). In the form operation, the IC unit leads or pins are formed to desired shapes, and in the singulate operation, the IC units are separated from the strip or strip section. Next, the singulated units may be inspected (at 122) using optical scanning equipment, for example, to check markings, shapes of leads or pins, alignment of leads or pins of an IC unit, and so forth. Inked units may be identified by the optical scanning equipment as bad units. The functional IC units may then be loaded into a shipping transport medium (e.g., tape/reel, tubes, or trays).

Referring to FIG. 5, an example test system 400 may include a temperature chamber or other housing 402 having one or more ports or channels 404 for receiving corresponding test assemblies 300. Temperature in the temperature chamber 402 may be varied during testing. A driver and multiplexer array 406 may be coupled between an IC tester 408 and the channels 404. The IC tester 408, which may include a test pattern generator, is adapted to generate test signals that are driven by the driver and multiplexer array 406 to one of the multiple channels 404. Based on some addressing or identification scheme, the array 406 may route the test signals to one of the channels to access a test assembly 300 coupled to that channel. According to some embodiments, each IC unit in a test assembly 300 may be individually selected or addressed for testing. Each socket in a test assembly 300 may be identified by the tester 408 either by a bar code scheme or by an identifier (e.g., extra pin or ping provided by the socket) readable by the tester electronically.

The test system 400 may be a relatively low cost system. Thus, as illustrated, the multiplexer and driver array 406 includes multiplexers and drivers to route test patterns generated by IC tester 408 to the appropriate one or more of the test assemblies 300. In such an embodiment, the more expensive electronics (such as dedicated drivers and test pattern generators) found in some high-speed testers may not be needed. It is to be understood, however, that more expensive testers may also be used with test assemblies according to embodiments of the invention.

In one example configuration, the test system 400 may be coupled to a central controller 410 (which maybe a computer for example). As an example, the central controller 410 may execute test algorithms and patterns to control test signals to the IC units in the strip sections. Further, the central controller 410 may control switching of signal lines in the multiplexer and driver array 406. The central controller 410 may also be used to vary the temperature of the temperature chamber 402.

Tests that may be performed on the IC units include functional tests and DC tests. Several techniques may be used to perform DC parametric tests (e.g., standby current tests, leakage tests, etc.) and tests for short or open circuits. One technique may be performed by a tester with a parametric measurement unit. Using a tester, the IC units may be mounted in the test assemblies 300. However, in the test assemblies 300, the leads of several IC units may share a signal line on the PCB or other support structure 270. Thus, detected short or open circuits are identified with a group of IC units rather than with a single IC unit.

In this first technique, isolation resistors may also be coupled to appropriate pins on each socket to prevent a short of one IC unit from affecting the ability to functionally test other units. Without isolation resistors coupled to pins of the socket, a short in a single IC unit may prevent other IC units from receiving or driving a signal line from the socket. The locations of IC units in a group may be identified and stored by the tester.

Once the DC tests have been performed, functional tests may be performed in the test system 400. With functional tests, each IC unit in a socket may be separately addressed for writes and reads. Test patterns may be written or programmed into IC units individually, in groups, or all at once in the functional test assembly, and the IC units may be read individually or in groups. The location of each unit that has failed functional tests (including burn-in tests) may be identified by the tester 408 since each unit is separately addressable and every pin on the socket may be checked by the tester. When a defective unit that has failed a functional test is identified, its location on the strip section is stored in a database (such as in a storage medium in the central controller 410) that may be accessed later to identify the defective unit.

After the test is complete, unloading equipment that unloads the test assemblies 300 from the tester housing 402 is able to read IDs of each socket. Based on information collected in the database stored in the central controller 410, for example, defective units on the strip sections are located. Defective units may be inked or otherwise marked for later identification.

Figure 6:
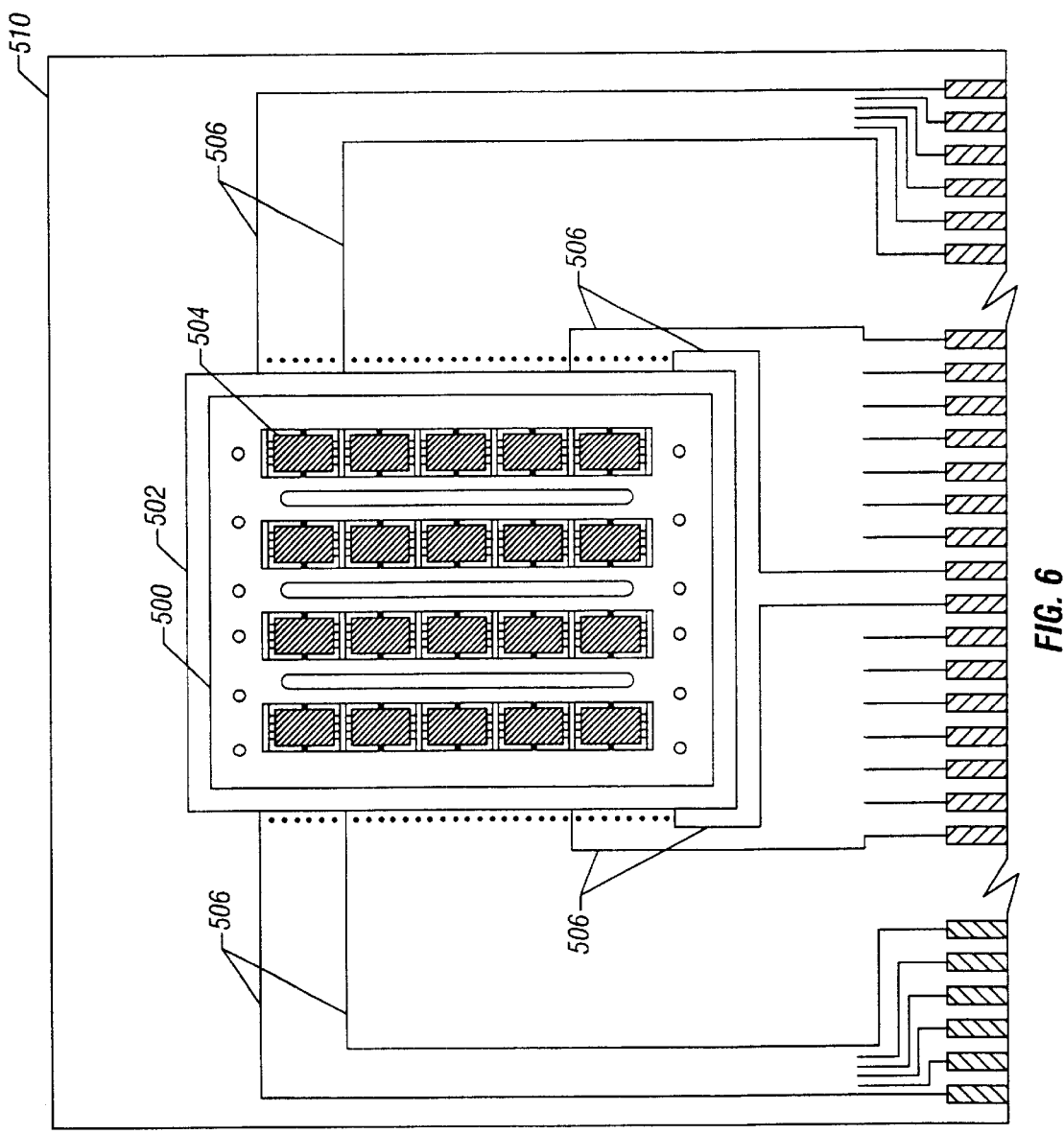
FIG. 6 illustrates a test assembly for performing DC tests.

As shown in FIG. 6, in an alternative embodiment that implements another technique to perform DC testing, sockets 502 for receiving a strip or strip sections 500 may be attached to a specially designed test assembly 510 (referred to as a "DC test assembly") that may be used to perform DC tests, including testing for short or open circuits, of IC units 504 in each strip or strip section 500. Such a DC test assembly 510 according to one embodiment may include dedicated lines 506 and relays to identify each lead of every IC unit 504 causing a short or other failure. The DC test assembly 510 may not be practical for functional tests due to the large number of tester channels that may be needed. IC units 504 identified using the DC test assembly 510 as having shorts (by detection of excessive current) or other DC failures may then be punched out or separated from a strip or strip section 500. Because the likelihood of shorts in the IC units is relatively low, less than about 0.1 percent with an 8-pin IC unit, for example, the extra step of punching out defective units may not impose too much of a burden.

In this embodiment, after DC tests have been performed in the DC test assembly, one or more sockets containing a strip or strip sections may be detached from the DC test assembly and attached to a functional test assembly 300 (FIG. 4). Functional tests may then be performed.

In one example embodiment, each strip may be divided into five strip sections each containing twenty IC units that are arranged in a matrix, e.g., a 5×4 matrix. If the five strip sections are mounted into five receiving sockets on the support structure 270, then a 5×20 matrix of IC units is provided in the test assembly 300. In one embodiment, each IC unit may include a serial EEPROM, although it is to be understood that the invention is not to be limited in this respect. Other types of IC units may include other types of EEPROMs, flash memories, DRAMs, SRAMs, microcontrollers, microprocessors, and the like. In addition, aside from IC units, other types of electronic devices may also be tested according to further embodiments of the invention.

By decoding various control lines, such as chip select, clocks, data in and out lines, etc., using conventional parallel testing techniques, the unit can be accessed for writes individually, as groups, or all at the same time, and the unit can be can be accessed for reads individually or as groups. Each lead of the IC units in a strip portion may be electrically coupled to a corresponding pin in the socket so that there are at least as many socket pins as there are IC unit leads. The socket pins are coupled to traces on the support structure 270, which may be a PCB for example, that are routed to edge connector contacts 272 formed on the support structure 270. Some signal lines may be shared by several socket pins so that the number of edge contacts 272 may be less than the number of socket pins.

Advantages offered by some embodiments of the invention may include one or more of the following. The functional testing method and apparatus is relatively low cost because of test cost reduction due to massive parallel testing. In addition, parallel testing can be performed by a relatively low cost tester in conjunction with a multiplexer and driver array. Further, multi-temperature testing may be performed in a cost effective fashion. The test assembly including a strip or strip sections on which IC units are attached is relatively easy to handle and has superior lead integrity. Further, because testing is performed during the assembly process, any lead damage may be repaired at the lead forming and singulation step (e.g., at 120 in FIG. 1). A small footprint is needed for the equipment, as the test assembly is much smaller than burn-in type load boards used in conventional systems in which individual sockets are used for singulated units. The size of the test assembly may be about a quarter of the size of load boards used in conventional systems. This allows use of a smaller temperature chamber for burn-in tests so that less mass needs to be heated and cooled to provide quicker test operations.

The total assembly, testing, and inspection cycle time may be reduced as testing becomes part of the assembly process rather than a separate operation. During testing, many loading and unloading and handling steps are eliminated using embodiments of the invention. In addition, once the IC units attached to a lead frame portion are inserted into a socket according to some embodiments, the leads of the IC units are protected from damage by test equipment or mishandling.

Other embodiments are within the scope of the following claims. For example, other IC units that may be tested include DRAMs, SDRAMs, SRAMs, microcontrollers, and other integrated circuit devices. In addition, electronic devices other than IC units may be tested using a test apparatus and method according to further embodiments. In addition, the number of sockets that may be attached to a support structure in a test assembly may be varied. If whole strips rather than strip sections are used, for example, then only one socket may be needed. To test even more electronic devices, additional sockets may be located on a support structure such as a PCB.

While the invention has been disclosed with respect to a limited number of embodiments, those skilled in the art will appreciate numerous modifications and variations therefrom. It is intended that the appended claims cover all such modifications and variations as fall within the true spirit and scope of the invention.

What is claimed is:

1. A method of assembling and testing electronic device units, comprising:

attaching the electronic device units to a strip;

mounting at least a portion of the strip in a test socket that includes conductors electrically coupled to the electronic device units on the strip portion;

providing test signals to the test socket to test the electronic device units;

marking electronic device units based on the test; and encapsulating the electronic device units on the strip and separating leads of the electronic device units from the strip.

2. The method of claim 1, further comprising separating the strip into a plurality of sections and mounting the strip sections into corresponding test sockets.

3. The method of claim 1, further comprising:

determining if any of the electronic device units fail a DC test; and removing one or more failed electronic device units from the strip.

4. The method of claim 1, further comprising:

coupling at least a portion of the strip in a DC test assembly to identify shorts of leads of one or more electronic device units; and removing the electronic device units having shorted leads from the portion of the strip.

5. The method of claim 4, further comprising mounting the test socket in a DC test assembly.

6. The method of claim 5, further comprising removing the test socket from the DC test assembly and mounting the test socket in a functional test assembly to receive the test signals.

7. A test assembly for testing electronic devices, comprising:

a plurality of sockets;

lead frame portions mounted in corresponding sockets, each lead frame portion being attached to a plurality of electronic devices, and each electronic device having at least a pin separated from the lead frame portion, the lead frame portions being cut from a single lead frame, wherein the electronic devices are arranged in a matrix in each lead frame portion.

8. The test assembly of claim 7, further comprising a support structure on which the sockets are mounted and a plurality of electrical contacts formed on the support structure to receive test signals.

9. The test assembly of claim 8, wherein the support structure includes a printed circuit board.

10. A method of forming a test assembly containing a plurality of electronic devices, comprising:

attaching the electronic devices in a two-dimensional matrix to a lead frame;

trimming leads of the electronic devices from the lead frame to electrically isolate the leads;

mounting at least a portion of the lead frame into a socket in the test assembly; and encapsulating the electronic devices after they have been attached to the lead frame.

11. The method of claim 10, attaching the socket to a support structure and forming electrical contacts in the support structure to receive test signals.

12. A tester for testing electronic devices, comprising:

test assemblies;

ports to receive the test assemblies; and a multiplexer and driver array to select one or more of the ports to receive test signals, each test assembly including a socket and a strip portion mounted in the socket and attached to a plurality of electronic devices and arranged to enable DC testing.

13. The test system of claim 12, further comprising a test pattern generator to provide test signals to the multiplexer and driver array.

14. A method of making electronic device units, comprising:

attaching the electronic device units to a lead frame;

trimming leads of the electronic device units from the lead frame;

mounting at least a portion of the lead frame into a socket in a test assembly;

performing a DC test of each electronic device unit;

performing a functional test of each electronic device; and separating the electronic device units from the lead frame.

15. The method of claim 14, further comprising marking the electronic device units based on the tests.

16. A test apparatus comprising:

a lead frame portion on which are attached a plurality of electronic device units each having one or more pins;

a socket in which the lead frame portion may be mounted, the socket having conductors electrically coupled to corresponding pins of the electronic device units; and a support structure containing conductive lines coupled to the socket and arranged to enable DC tests of an electronic device unit group less than all of the electronic device units.

17. The test apparatus of claim 1, further comprising one or more additional sockets and one or more additional lead frame portions mounted in the one or more additional sockets, each additional lead frame portion attached to a plurality of electronic devices, the conductive lines further coupled to the one or more additional sockets.

18. The test apparatus of claim 1, wherein the one or more pins of the electronic devices includes leads that have been separated from the lead frame portion.

19. The test apparatus of claim 1, wherein the conductive lines are arranged to enable separate DC tests of groups of the electronic device units.

20. The test apparatus of claim 1, wherein the conductive lines are arranged to enable DC tests of individual electronic device units.

21. The test apparatus of claim 1, wherein the lead frame portion enables disconnection of an electronic device unit that fails a DC test.

22. The test apparatus of claim 1, wherein the conductive lines are arranged to also enable functional tests.

23. The test apparatus of claim 1, wherein each conductive line is coupled separately to a corresponding electronic device unit pin.

24. The test apparatus of claim 1, wherein each conductive line is coupled to a corresponding group of electronic device unit pins.

* * * * *

UNITED STATES PATENT AND TRADEMARK OFFICE
CERTIFICATE OF CORRECTION

PATENT NO. : 6,392,427 B1  Page 1 of 1
DATED : May 21, 2002
INVENTOR(S) : Hsu Kai Yang It is certified that error appears in the above-identified patent and that said Letters Patent is hereby corrected as shown below:

Column 8,
Line 26, after "device" insert -- unit --;
Line 41, "1" should be -- 16 --;
Line 47, "1" should be -- 16 --;
Line 50, "1" should be -- 16 --;
Line 53, "1" should be -- 16 --;
Line 56, "1" should be -- 16 --;
Line 58, "1" should be -- 16 --;
Line 60, "1" should be -- 16 --; and
Line 63, "1" should be -- 16 --.

Signed and Sealed this

Fifteenth Day of October, 2002

*Attest:*

*Attesting Officer*

JAMES E. ROGAN
*Director of the United States Patent and Trademark Office*